US008373510B2

United States Patent
Kelkar

(10) Patent No.: US 8,373,510 B2
(45) Date of Patent: Feb. 12, 2013

(54) PROGRAMMABLE FILTER FOR LC TANK VOLTAGE CONTROLLED OSCILLATOR (VCO), DESIGN STRUCTURE AND METHOD THEREOF

(75) Inventor: Ram Kelkar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 12/106,399

(22) Filed: Apr. 21, 2008

(65) Prior Publication Data

US 2009/0261916 A1    Oct. 22, 2009

(51) Int. Cl.
*H03L 7/00* (2006.01)

(52) U.S. Cl. ............. 331/16; 331/17; 331/36 C; 331/44; 331/177 R; 331/177 V; 375/375; 375/376

(58) Field of Classification Search ................... 331/16, 331/17, 36 C, 44, 177 R, 177 V; 375/375, 375/376
See application file for complete search history.

(56) References Cited

U.S. PATENT DOCUMENTS

| | | | |
|---|---|---|---|
| 4,482,869 A | 11/1984 | Hirata | |
| 5,517,534 A | 5/1996 | Knierim | |
| 5,537,448 A | 7/1996 | Schwarz et al. | |
| 5,821,817 A | 10/1998 | McCorkle | |
| 6,054,903 A | 4/2000 | Fiedler | |
| 6,057,739 A | 5/2000 | Crowley et al. | |
| 6,091,303 A | 7/2000 | Dent | |
| 6,111,470 A | 8/2000 | Dufour | |
| 6,542,040 B1 | 4/2003 | Lesea | |
| 6,552,617 B1 | 4/2003 | Griffith et al. | |
| 6,630,860 B1 | 10/2003 | Anumula et al. | |
| 6,747,497 B2 | 6/2004 | Ingino, Jr. | |
| 6,765,445 B2 | 7/2004 | Perrott et al. | |
| 6,809,600 B2 | 10/2004 | Chang et al. | |
| 6,856,180 B1 | 2/2005 | Starr et al. | |
| 6,954,088 B2 * | 10/2005 | Masenas | 327/101 |
| 6,980,060 B2 | 12/2005 | Boerstler et al. | |
| 6,998,923 B2 * | 2/2006 | Melanson | 331/17 |
| 7,026,879 B2 * | 4/2006 | Booth | 331/17 |
| 7,109,809 B1 | 9/2006 | Groen et al. | |
| 7,268,631 B2 * | 9/2007 | Wilson | 331/16 |
| 7,330,058 B2 * | 2/2008 | Lin | 327/157 |
| 2005/0111605 A1 * | 5/2005 | Loke et al. | 375/375 |
| 2006/0009184 A1 * | 1/2006 | Goldman | 455/260 |
| 2006/0208805 A1 * | 9/2006 | Galloway et al. | 331/16 |
| 2006/0255864 A1 * | 11/2006 | Vandel | 331/16 |
| 2008/0012654 A1 * | 1/2008 | Han et al. | 331/167 |

* cited by examiner

*Primary Examiner* — Arnold Kinkead
*Assistant Examiner* — Richard Tan
(74) *Attorney, Agent, or Firm* — David Cain; Roberts Mlotkowski Safran & Cole, P.C.

(57) ABSTRACT

A programmable filter for LC tank voltage controlled oscillator (VCO) and a design structure for a programmable filter for LC tank VCO. The programmable filter includes a proportional control comprising a plurality of capacitance biased by different input voltages and an integral control comprising a filter element with a capacitance C1 and a set of capacitance biased by a voltage output of the filter element.

26 Claims, 8 Drawing Sheets

PROGRAMMABLE FILTER FOR LC TANK VOLTAGE CONTROLLED OSCILLATOR (VCO), DESIGN STRUCTURE AND METHOD THEREOF

FIELD OF THE INVENTION

The invention relates to a programmable filter for a LC tank voltage controlled oscillator (VCO), a design structure for a programmable filter for a LC tank VCO and a method of controlling a frequency of the VCO.

BACKGROUND DESCRIPTION

FIG. 1 shows a schematic of a traditional connection of a loop filter to a LC tank VCO in phase locked loop circuits. In the schematic of FIG. 1, the voltage v is applied to one end of a set of capacitors in a filter element whose value determines, along with the value of the inductance, the oscillation frequency of the VCO.

More specifically as shown in FIG. 1, in the conventional VCO architecture, a charge pump feeds into an RCC filter. The charge pump pumps current pulses in or draws current pulses out based on signals INC and DEC which are the phase detector outputs. In the conventional VCO architecture, the RCC filter has two main components, a resistor R and a capacitor C1. The output of R and C1 is VCNTL which is used to control the capacitance value to change the frequency. A second capacitor C2 is used to filter out high frequency variations. Since C2 is much lower than C1 the majority of the charge pump current pulse flows in the R-C1 path.

In the circuitry of FIG. 1, the proportional control is the resistor R and the integral control is the capacitor C1. The proportional control causes a different change in frequency based on whether the VCO is working at a low or a high frequency. As such, as the VCNTL is used to control the capacitance value to change the frequency, the gain of the VCO will change in frequency at a change in voltage at the VCTNL. This being the case, the gain is higher at a higher frequency and lower at a lower frequency.

More specifically, the current pulse i flowing in the resistor R creates a voltage pulse which forms the proportional control (PC), and the current pulse flowing in C1 forms an integral control (IC) since the voltage change is the integral of the current pulse. The voltage v thus created at the filter node VCNTL is described as:

$$v = i \times R + \frac{1}{C1} \times \int i \, dt \qquad (1)$$

The proportional control signal corresponds to the first part of equation (1). In this case, it is seen that the PC portion of the control voltage changes immediately as the current i into the filter changes. Also, the IC portion is a slower change as it is an integration of the equation.

Thus, in the configuration of FIG. 1 the current pulse increases the voltage v at node VCNTL which is reflected in the frequency increase. The effect of the proportional control is to thus immediately increase the frequency since the voltage v increases immediately as shown in equation (1). The frequency change caused by the voltage v is:

$$\Delta f = K \times v \qquad (2)$$

K is the gain of the VCO expressed in MHz/V, and is determined by the size of the variable capacitors connected to VCNTL. Also, the voltage v causes a change in the capacitance value which causes a frequency change. The parameter K captures both changes in one variable.

FIG. 2 shows an open loop gain GH for a conventional filter as the VCO gain changes. It is seen that the loop crossover frequency changes with gain. FIG. 3 shows a closed loop input-output gain as the VCO gain changes. It is seen that the −3 dB bandwidth changes with gain. As such, this makes it difficult to control the noise at the PLL output since it is this bandwidth that controls the amount of input noise that is fed through to the output.

Accordingly, there exists a need in the art to overcome the deficiencies and limitations described hereinabove.

SUMMARY OF THE INVENTION

In a first aspect of the invention, a programmable filter comprises a proportional control comprising a plurality of capacitance biased by different input voltages. The programmable filter also comprises an integral control comprising a filter element with a capacitance C1 and a set of capacitance biased by a voltage output of the filter element.

In another aspect of the invention, a method comprises controlling capacitance value of a proportional control such that the proportional control stays constant as VCO operating frequency changes over a VCO frequency range.

In another aspect of the invention, a design structure is embodied in a machine-readable medium for designing, manufacturing, or testing an integrated circuit. The design structure comprises a proportional control comprising a plurality of capacitance biased by different input voltages, and an integral control comprising a filter element with a capacitance C1 and a set of capacitance biased by a voltage output of the filter element.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The invention relates to a programmable filter for a LC tank voltage controlled oscillator (VCO), a design structure for a programmable filter for a LC tank VCO and a method of controlling a frequency of the VCO. In embodiments, the loop filter and VCO can be used in a traditional PLL architecture. By implementing the invention, it is possible to control the capacitance value change to ensure that the frequency change due to the proportional control stays constant as the VCO operating frequency changes over the VCO frequency range.

In implementation, the present invention provides a proportional control and an integral control. The proportional control includes two sets of variable capacitors connected to nodes VM1 and VP1. The integral control includes a filter element with a single capacitance outputting a voltage VCNTL1 into a single set of variable capacitors. The variable capacitors of the integral control are also connected to nodes VM1 and VP1. In embodiments, the variable capacitors of the proportional control are biased by a steady state input voltage (i.e., VCC) which is a constant bias voltage independent of the VCO operating frequency. In a typical PLL the loop gain varies as a function of output frequency because of the non-linear capacitance vs. voltage characteristic of the voltage controlled VCO tuning capacitors (varactors); whereas, the present invention breaks a paradigm of loop filter and VCO interaction making possible higher performing PLLs.

Figure 4:
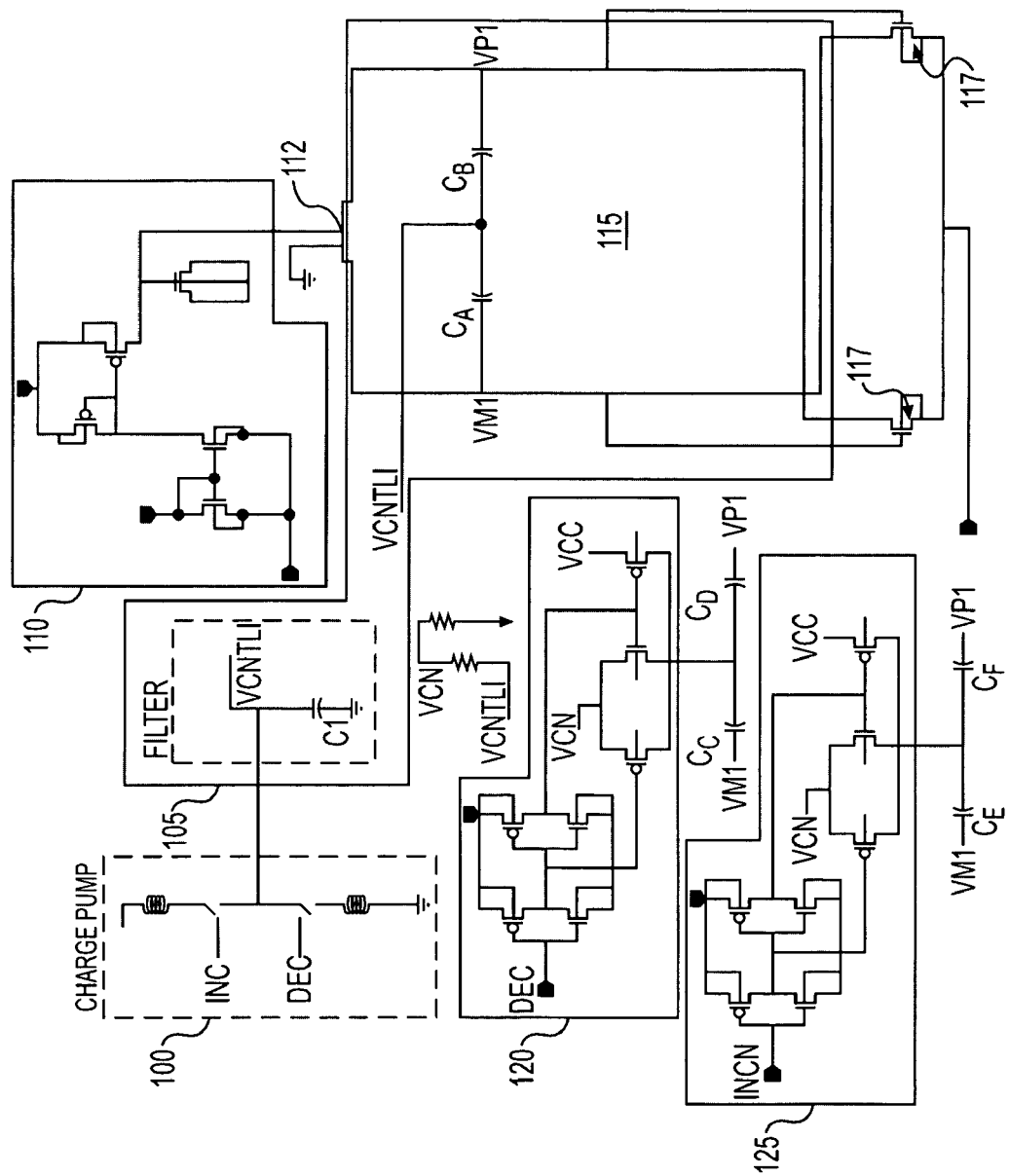
FIG. 4 shows a topology of a loop filter feeding voltage controlled oscillator (VCO) in accordance with the invention.

FIG. 4 shows a circuit topology in accordance with an aspect of the present invention. As shown in FIG. 4, an integral control 115 includes a filter 105 (with capacitance, C1) and capacitances $C_A$ and $C_B$. A charge pump 100 feeds into the filter 105. More specifically, the charge pump 100 pumps current pulses in or draws current pulses out based on the signals INC (increase) and DEC (decrease). A voltage (VCNTL1) is controlled by the current pulses across C1, which biases the capacitances $C_A$ and $C_B$ in the integral control 115. Additionally, a current source 110 feeds current into an oscillator which includes an inductor 112, FETs 117 and capacitors $C_A$, $C_B$ and $C_C$, $C_D$ and $C_E$, $C_F$.

FIG. 4 also shows a proportional control which includes two sets of variable capacitors $C_C$, $C_D$ and $C_E$, $C_F$ controlled by the phase detector outputs DEC and INCN (INCN is the inverse of INC, i.e., not increase) and implemented using two switches 120, 125. The supply voltages to the switches 120, 125 are VCN and VCC and the output is a change in the capacitance at nodes VM1 and VP1. The supply voltage VCC is a steady state voltage independent of oscillator frequency.

The supply voltage VCN, on the other hand, is derived from VCNTL1 and is lower than VCC, thus the value of the variable capacitors increases when DEC goes to logic 1. This increase reduces the frequency and the effect lasts only as long as DEC is 1. Similarly, when INCN goes low (e.g., at logic 1 for most of the cycle), the variable capacitors controlled by INCN reduces in value (since its bias switches between VCN and VCC) leading to an increase in frequency. This reduction in capacitance is applied only as long as INCN is low. As such, controlling the capacitance value change (by switching between bias voltage VCC and VCN in the proportional control) ensures that the frequency change (See, Δf1 in equation (3)) due to the proportional control stays constant as the VCO operating frequency changes over the VCO frequency range.

More specifically, in the configuration of FIG. 4 a change in the capacitance is the function of the difference between the VCC and VCN voltage. Also, the VCO gain is a function of the voltage at VCNTL1. In implementation, the gain is high if the VCNTL1 is high, and similarly, the gain is low if the VCNTL1 is low. So, since the proportional control works by changing the value of the capacitance, either a reduction or an increase, the change in capacitance is a function of the VCO gain through the voltage VCN. This is because the voltage at VCN is controlled by the voltage at VCTNL1.

To increase the frequency, DEC is low, INC is high and INCN is low. To decrease the frequency, DEC is high, INC is low, and INCN is high. In the normal state, i.e., neither high nor low, two scenarios are possible:

(i) INC is low, DEC is low and INCN is high; or
(ii) INC is high, DEC is high and INCN is low.

The phase lock loop should spend most time in the normal state (i) as this is a base state of the cycle.

In the normal state (i), since DEC is low the capacitance $C_C$ and $C_D$ is biased to VCC. Also, since INC is low the capacitance $C_E$ and $C_F$ is biased to VCN.

To increase the frequency, i.e., in the case that INC is high and INCN is low, the bias voltage of $C_E$ and $C_F$ is switched from VCN to VCC for as long as INCN is low. This reduces the capacitance of $C_E$ and $C_F$ since the voltage VCC is higher than the voltage of VCN. Similarly, in the case that INC is low and INCN is high, the bias voltage of $C_E$ and $C_F$ is biased to VCN.

On the other hand, to decrease frequency, i.e., INC is low, DEC is high and INCN is high, the bias voltage of $C_C$ and $C_D$ is switched from VCC to VCN. This increases the capacitance as long as DEC is high.

In the normal state (ii) (when DEC is high, INC is high and INCN is low) $C_C$ and $C_D$ will be biased to VCN and $C_E$ and $C_F$ will be biased to VCC. In this scenario, the capacitance of $C_C$ and $C_D$ has increased because they are biased to VCN; whereas the capacitance of $C_E$ and $C_F$ has decreased because they are biased to VCC. The net change in the capacitance, compared to the capacitance of the base state, is thus 0. The duration of the normal state (ii) is a very small portion of the cycle.

The equation describing the frequency change for the topology of FIG. 4 is:

$$\Delta f = (K1 \times \Delta C) + \left(\frac{K2}{C1} \times \int i dt\right), \Delta f1 = (K1 \times \Delta C) \quad (3)$$

In equation (3), K1 is the gain corresponding to the change in variable capacitance controlled by DEC and INCN. K2 corresponds to the variable capacitance at VCNTL1. C1 is the capacitor value in the filter element. ΔC is a difference in capacitance and Δf is a change in frequency. Δf1 is the frequency change due to the proportional control.

As noted above, the voltage VCN is derived from VCNTL1 and increases as VCNTL1 increases. Thus, as seen mathematically, at low values of VCNTL1 the variable capacitance implementing the proportional control will see a larger change in capacitor value due to the larger bias voltage swing from VCC to VCN. On the other hand, the proportional control capacitor value change will be lower for higher values of VCNTL1.

An equivalent resistor $R_{eq}$ can be calculated:

$$Req = \frac{\Delta f1}{i \times K2}$$

The resistor $R_{eq}$ is the equivalent resistor if the traditional filter is used. In the above equation, i is the charge pump current flowing for the duration of the DEC (INCN) pulse and K2 is the integral path gain. In this case the gain K2 would apply to both the integral and proportional controls.

Equation (3) can be re-written as:

$$\Delta f = (K2 \times i \times Req) + \left(\frac{K2}{C1} \times \int i dt\right) \quad (4)$$

In equation (4), the product of K2×$R_{eq}$ stays constant (with the assumption that the charge pump current is fixed), because the proportional control results in a constant frequency change as described in equation (3). The gain K2 is the gain of the integral control and it typically increases as the VCO frequency increases. Also, $R_{eq}$ changes in proportion so that $R_{eq}$ is low when K2 is high and vice-versa.

Figure 5:
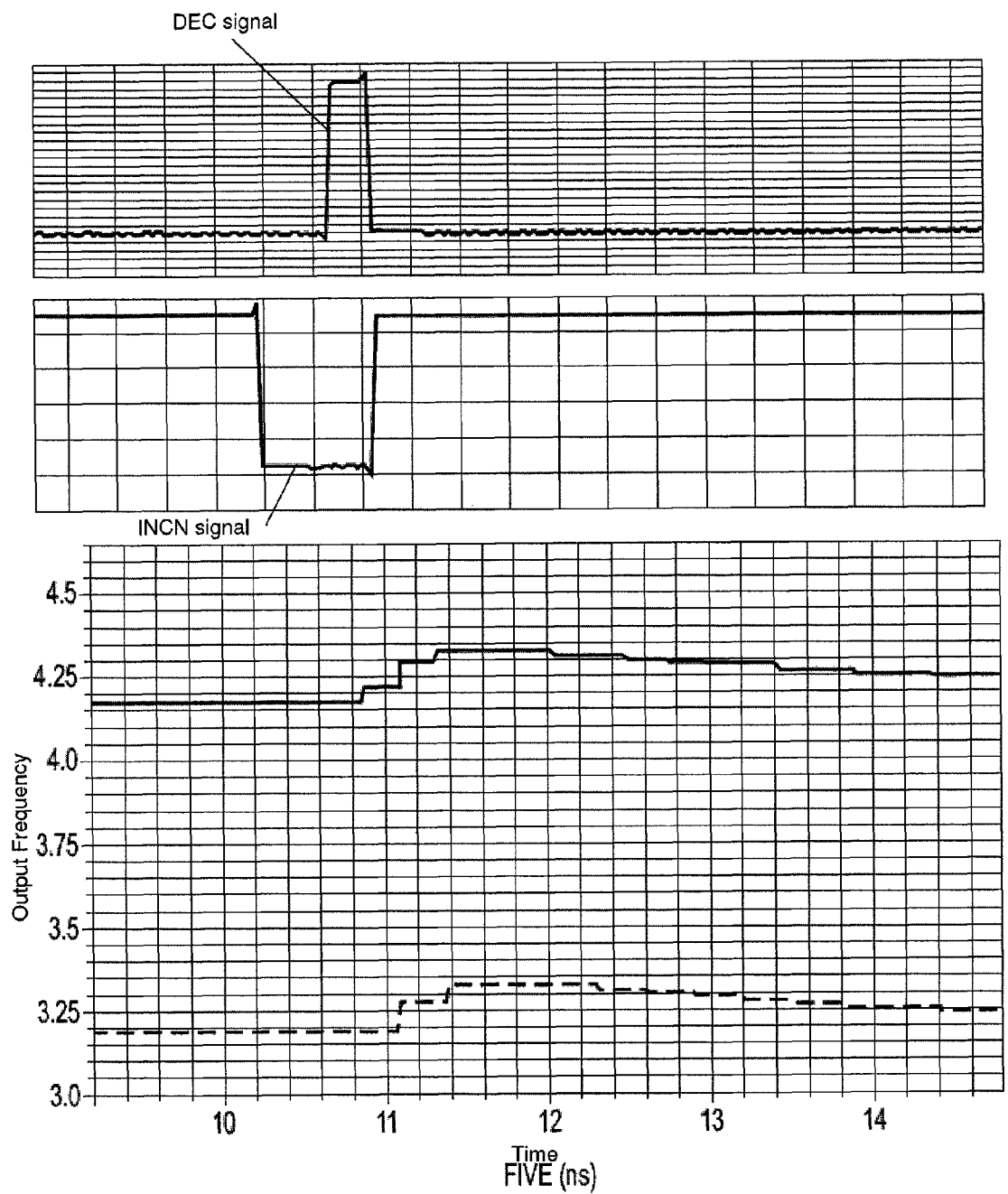
FIG. 5 shows an action of the proportional control path in the loop filter feeding VCO of FIG. 4.

FIG. 5 shows the action of the proportional control path in accordance with the configuration of the present invention. In particular, FIG. 5 illustrates the usefulness of being able to control the gains independently; i.e., in essence the proportional control portion of the control loop can be dialed down when the PLL has achieved lock. In the locked state the charge pump sees equal pulse width signals INC and DEC from the phase detector, and this, depending on the dc voltage at the filter, can result in an undesirable current pulse.

In FIG. 5, the top two traces are the DEC and INCN signals respectively. In this case, the phase detector was set up so that the loop is increasing the frequency and, as such, the width of INCN is higher than that of DEC. The bottom two traces show the output frequency at two values of control voltage VCNTL1. At the higher value of VCNTL1 the VCO is running at a higher frequency when the INCN pulse switches and the VCO frequency then increases before settling down to its initial value. Also, the lowest trace shows the VCO running at a lower value of VCNTL1 which corresponds to a lower frequency. The change in frequency in the two lower cases is very similar, e.g., 144 MHz for the lower VCO frequency and 153 MHz for the higher VCO frequency. This is accomplished by making the amount of capacitance change a function of the VCNTL1 voltage.

Another advantage of the present configuration is the effect on loop bandwidth. The open loop gain GH for the conventional case can be written as:

$$GH = K \times Ag \times Iref \times \frac{(1 + s \times C1 \times R)}{(2 \times \pi \times s^2 \times C1)} \quad (5)$$

Figure 1:
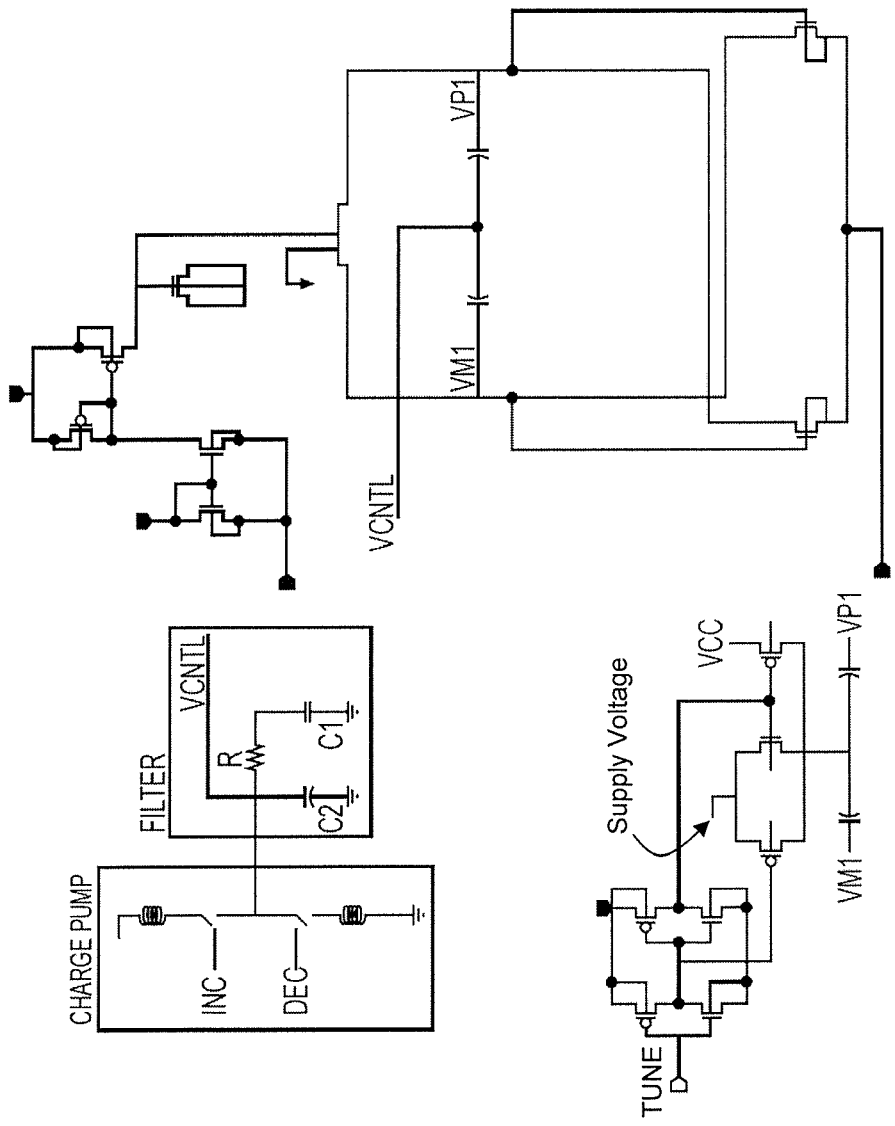
FIG. 1 shows a conventional topology of a loop filter feeding voltage controlled oscillator (VCO)
Figure 2:
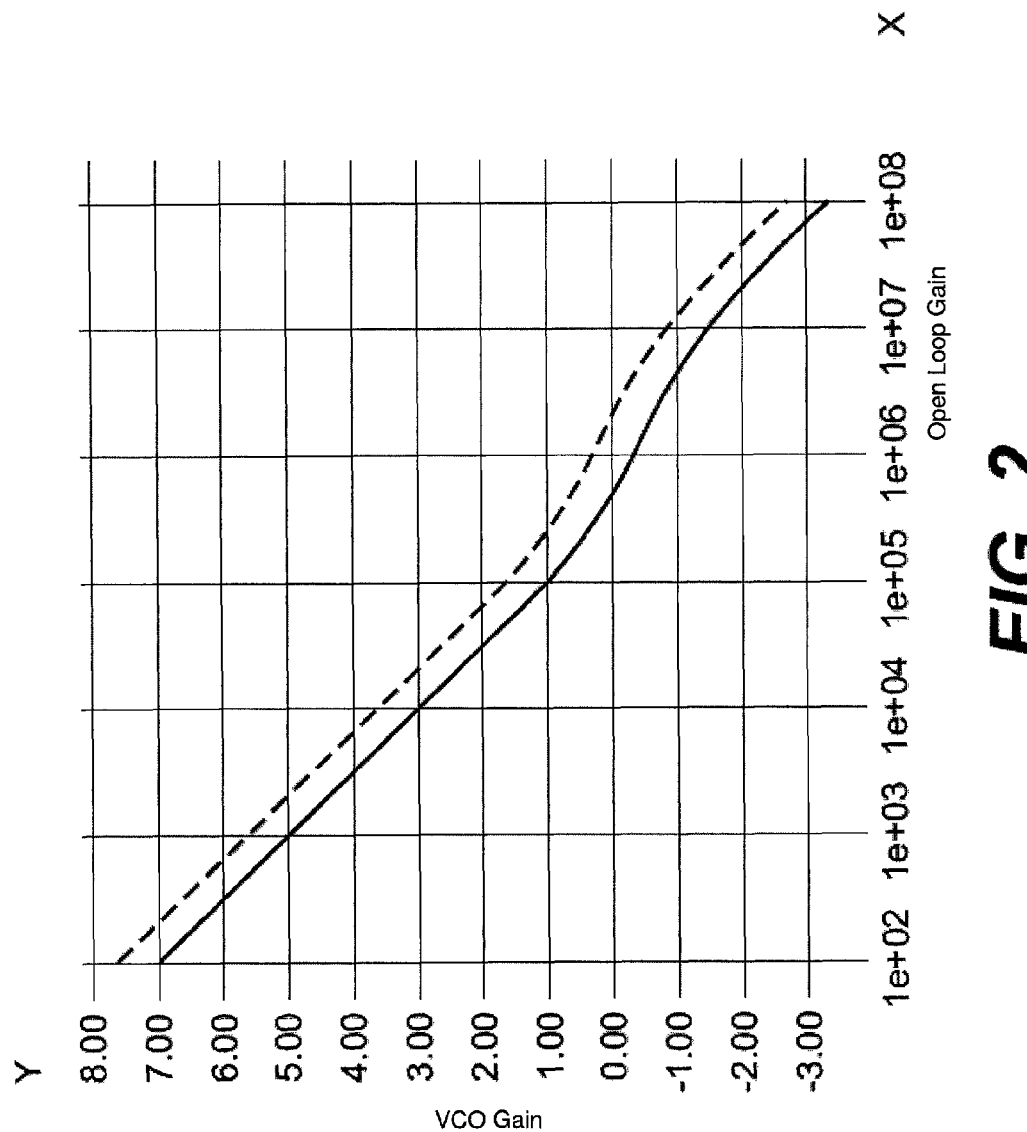
FIG. 2 shows an open loop gain GH as the VCO gain changes for a conventional filter.

In equation (5), K is the VCO gain, Ag is the charge pump gain and $I_{ref}$ is the charge pump reference current. The effect of the small capacitor C2 in the filter is neglected in the above equation. It is seen that as the VCO gain K changes the open loop gain will also change, as illustrated in FIG. 2.

In contrast, the open loop gain using the programmable filter of the present invention can be written as:

$$GH = K2 \times Ag \times Iref \times \frac{(1 + s \times C1 \times Req)}{(2 \times \pi \times s^2 \times C1)} \quad (6)$$

In equation (6), the effective resistor $R_{eq}$ is automatically scaled as the gain K2 changes.

Figure 6:
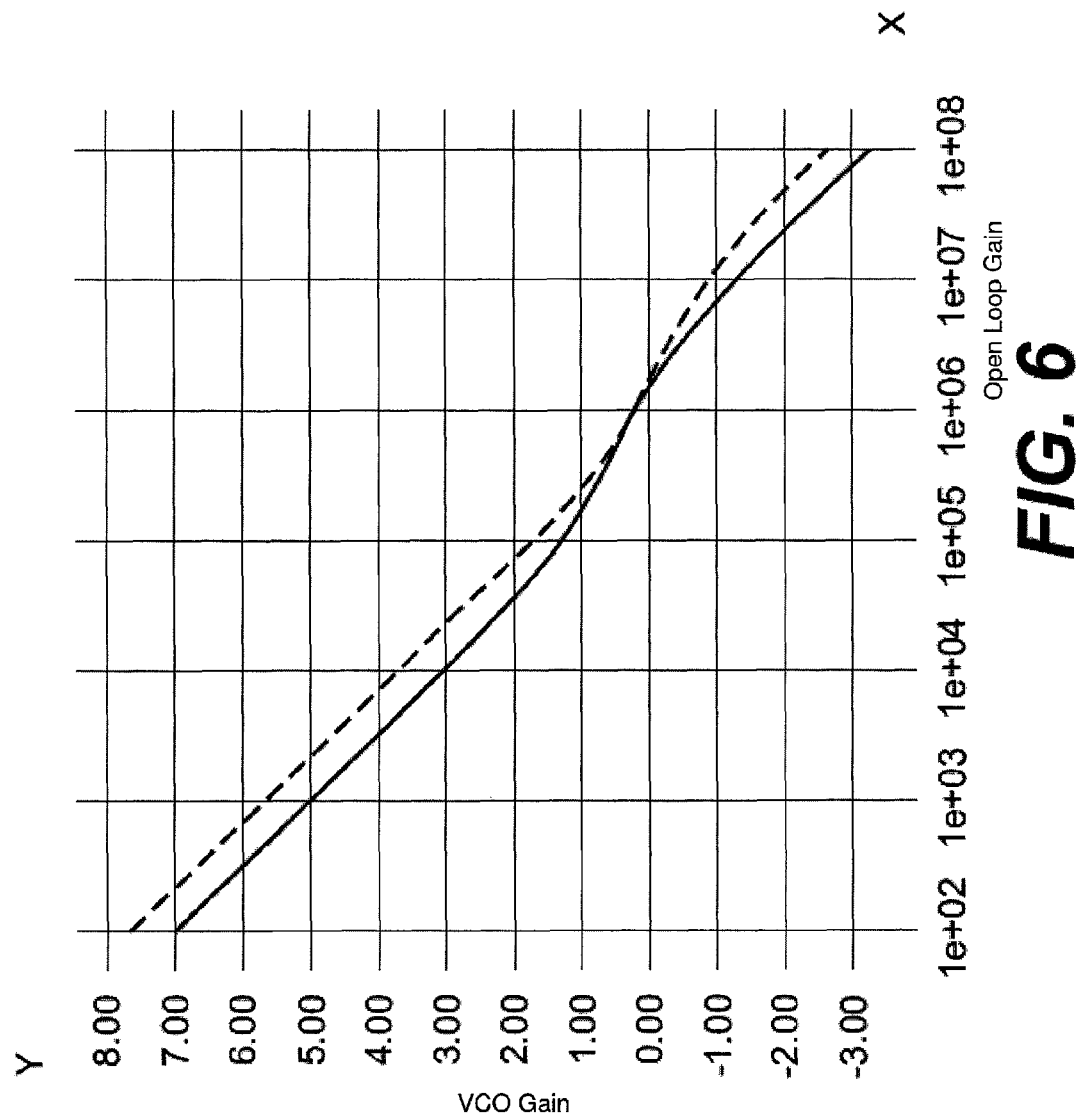
FIG. 6 shows an open loop gain GH as VCO gain changes for a programmable filter in accordance with the invention.

FIG. 6 shows an open loop gain GH as VCO gain changes for the programmable filter in accordance with the invention. In FIG. 6, it is seen that the open loop gain using the circuit of the present invention automatically adjusts the $R_{eq}$. Also, it is seen that the loop crossover frequency is essentially unchanged for the VCO gain change. The change of the loop crossover frequency has an effect on the closed loop bandwidth.

Figure 3:
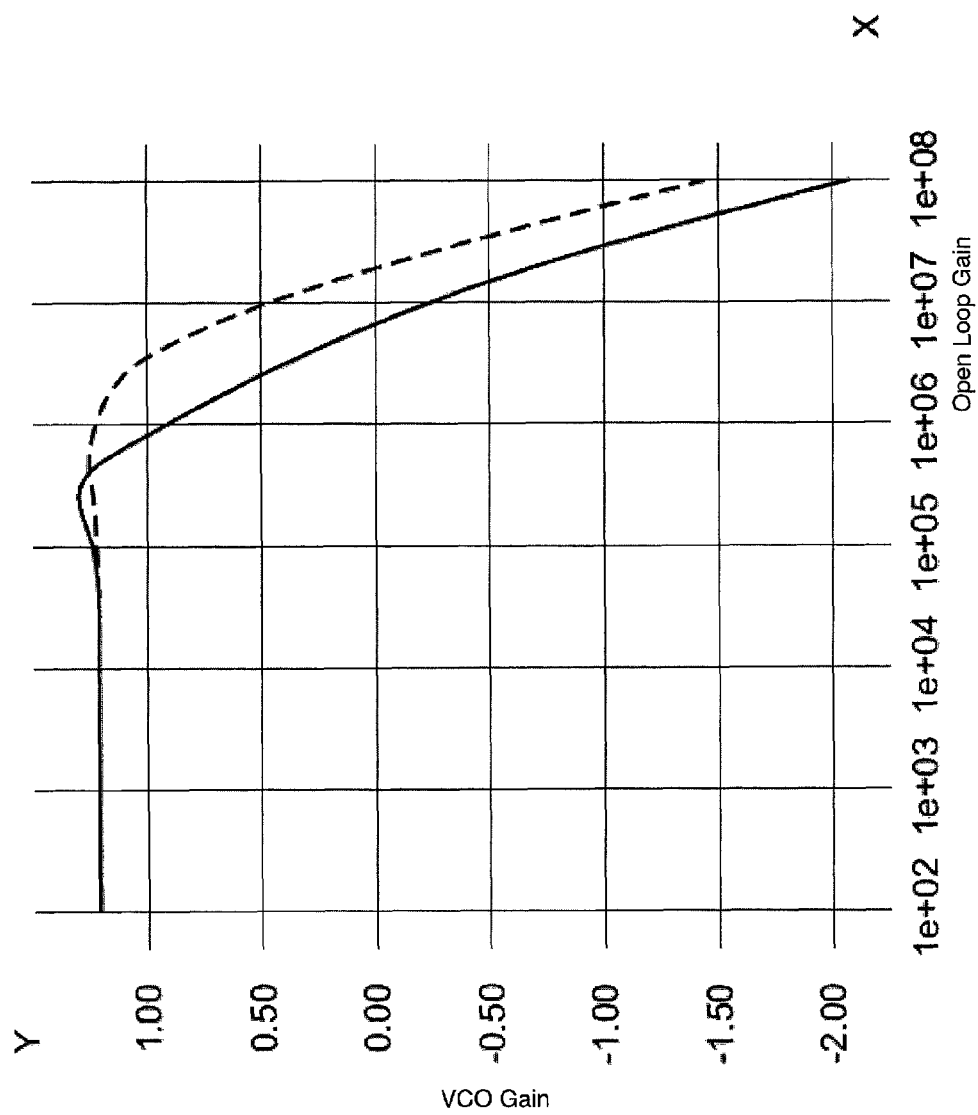
FIG. 3 shows a closed loop gain as the VCO gain changes for a conventional filter.
Figure 7:
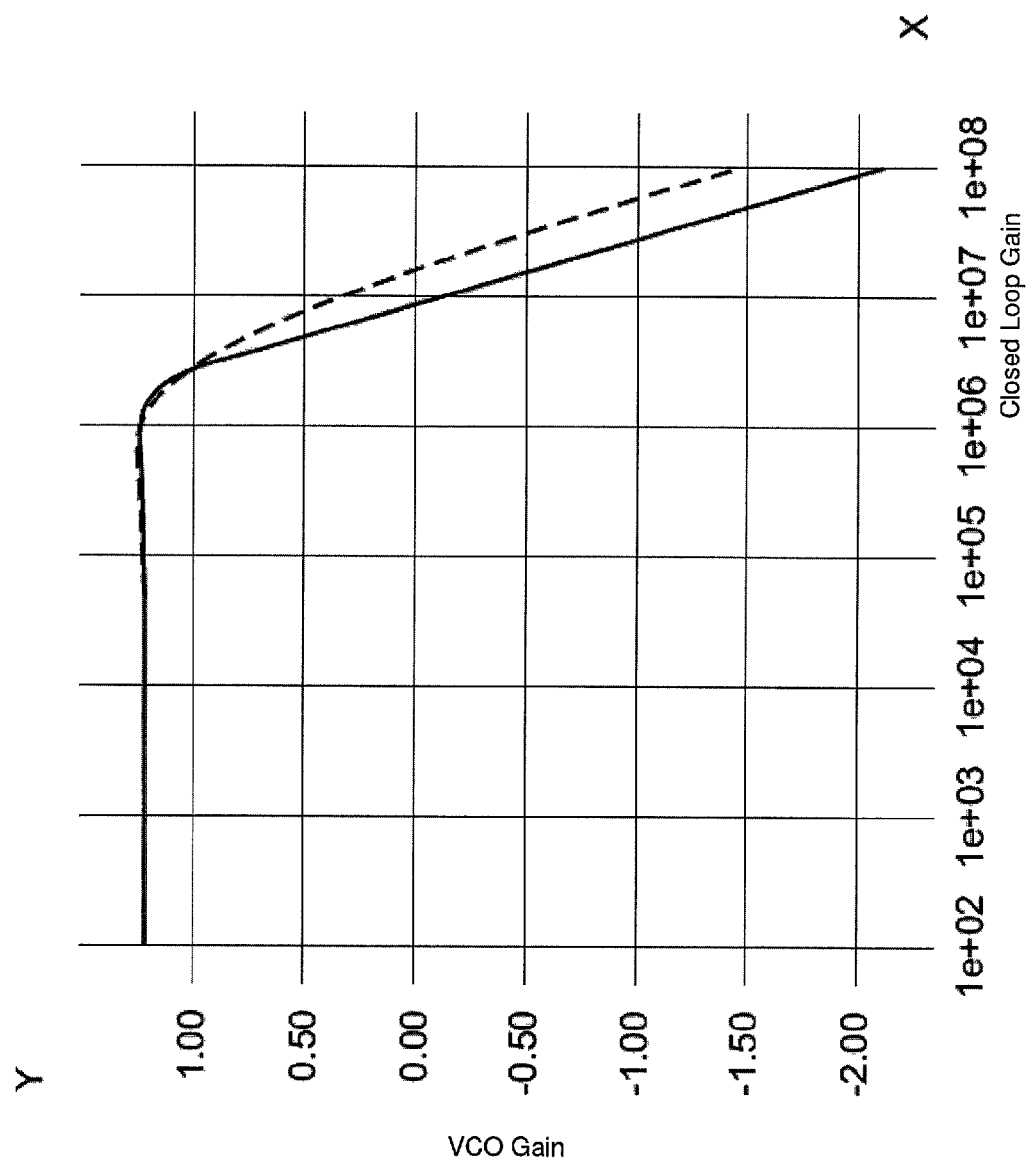
FIG. 7 shows a closed loop gain as the VCO gain changes for a programmable filter in accordance with the invention.

FIG. 7 shows a closed loop gain as the VCO gain changes for a programmable filter in accordance with the invention. In FIG. 7, it can be seen that the bandwidth is now essentially unchanged as the VCO gain changes. (FIG. 7 should be compared to FIG. 3 which shows a closed loop gain change using a conventional filter.)

Accordingly, as should now be understood by those of skill in the art, the present invention provides for a technique whereby the effective value of the filter resistor can be changed. That is, the present technique can be used to change the effective resistance when needed. In doing so, there can be lower noise due to the lower proportional control. Also, the technique of the present invention results in the closed loop bandwidth being independent of the VCO gain.

Design Structure

Figure 8:
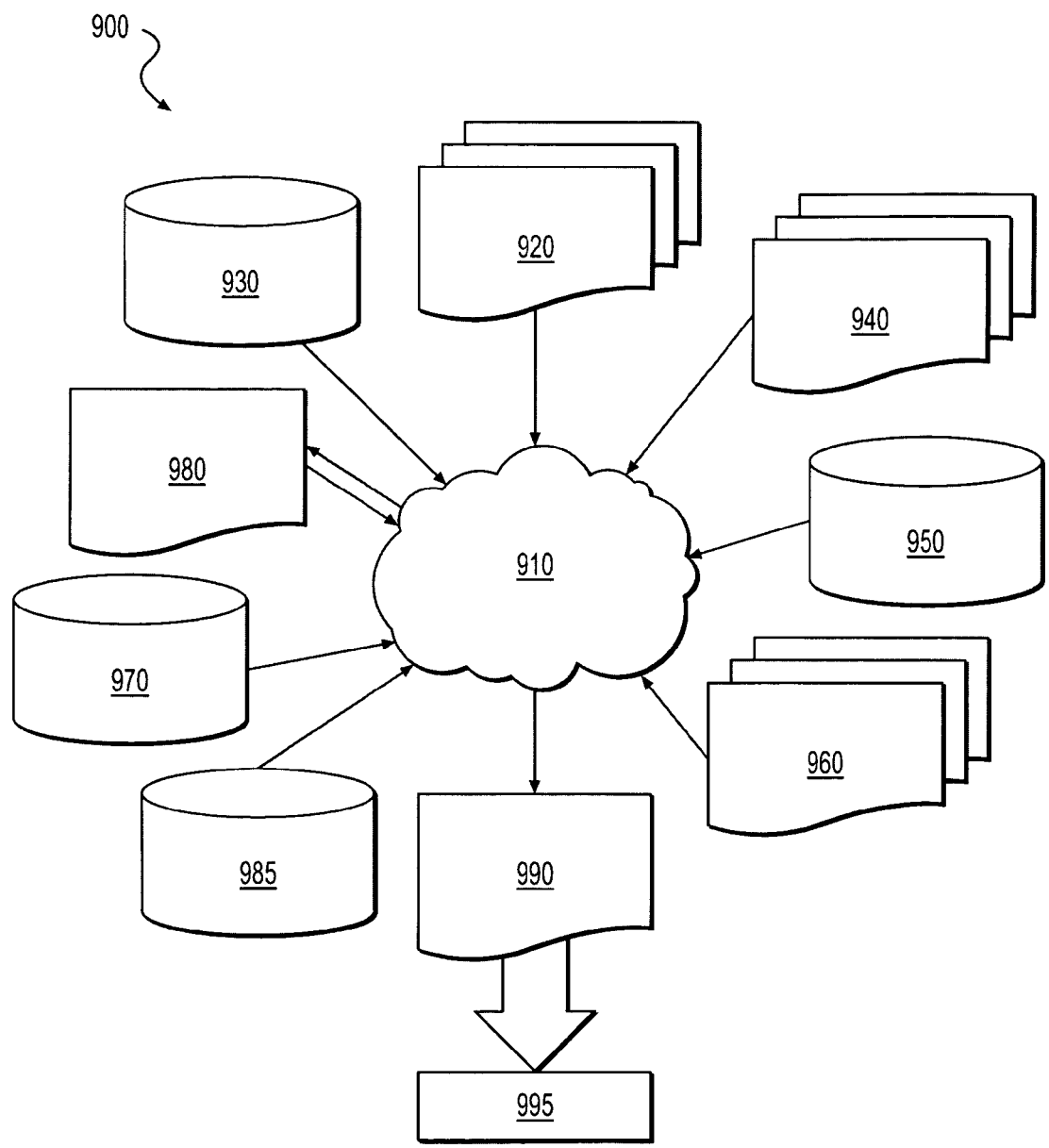
FIG. 8 is a flow diagram of a design process used in semiconductor design, manufacture, and/or test.

FIG. 8 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIG. 4 in the form of schematics or HDL, a hardware-description language (e.g., Verilog, VHDL, C, etc.). Design structure 920 may be contained on one or more machine-readable medium. For example, design structure 920 may be a text file or a graphical representation of an embodiment of the invention as shown in FIG. 4. Design process 910 preferably synthesizes (or translates) an embodiment of the invention as shown in FIG. 4 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 4, along with any additional integrated circuit design or data (if applicable), into a second design structure 990. Design structure 990 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 4. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of exemplary embodiments, those skilled in the art will recognize that the invention can be practiced with modifications and in the spirit and scope of the appended claims.

What is claimed is:

1. A programmable filter, comprising:
a proportional control comprising a plurality of sets of variable capacitors connected to nodes VM1 and VP1 and biased by different input voltages, wherein the proportional control controls a capacitance value change to ensure a frequency change due to the proportional control remains constant as a voltage controlled oscillator (VCO) operating frequency changes over a VCO frequency range; and
an integral control comprising a filter element with a capacitor C1 and a set of variable capacitors connected to the nodes VM1 and VP1 and biased by a voltage output of the filter element,
wherein one of the different input voltages is a variable voltage derived from the voltage output of the filter element.

2. A programmable filter, comprising:
a proportional control comprising a plurality of capacitors biased by different input voltages, wherein the proportional control controls a capacitance value change to ensure a frequency change due to the proportional control remains constant as a voltage controlled oscillator (VCO) operating frequency changes over a VCO frequency range; and
an integral control comprising a filter element with a capacitor C1 and a set of capacitors biased by a voltage output of the filter element,
wherein switching between the different input voltages is controlled by phase detector outputs decrease (DEC) and increase inverse (INCN).

3. The programmable filter of claim 2, wherein:
a first input voltage of the different input voltages is a steady state input voltage (VCC) which is a constant bias voltage independent of voltage controlled oscillator (VCO) operating frequency; and
a second input voltage of the different input voltages is a variable voltage derived from the voltage output of the filter element (VCNTL1).

4. The programmable filter of claim 3, wherein the VCNTL1 is lower than the VCC.

5. The programmable filter of claim 3, wherein:
the VCC is a steady state voltage independent of oscillator frequency; and
the VCN is derived from the VCNTL1 and is lower than the VCC, such that a value of the plurality of capacitors increases when the DEC goes to logic 1 thereby reducing the VCO operating frequency.

6. A programmable filter, comprising:
a proportional control comprising a plurality of capacitors biased by different input voltages, wherein the proportional control controls a capacitance value change to ensure a frequency change due to the proportional control remains constant as a voltage controlled oscillator (VCO) operating frequency changes over a VCO frequency range; and
an integral control comprising a filter element with a capacitor C1 and a set of capacitors biased by a voltage output of the filter element,
wherein the plurality of capacitors includes two sets of variable capacitors ($C_C$, $C_D$) and ($C_E$, $C_F$) controlled by phase detector outputs decrease (DEC) and increase inverse (INCN).

7. A programmable filter, comprising:
a proportional control comprising a plurality of capacitors biased by different input voltages, wherein the proportional control controls a capacitance value change to ensure a frequency change due to the proportional control remains constant as a voltage controlled oscillator (VCO) operating frequency changes over a VCO frequency range; and
an integral control comprising a filter element with a capacitor C1 and a set of capacitors biased by a voltage output of the filter element,
wherein, in a normal state, capacitors $C_C$ and $C_D$ of the plurality of capacitors are biased to a steady state voltage (VCC) and capacitors $C_E$ and $C_F$ of the plurality of capacitors are biased to a voltage (VCN) derived from the voltage output of the filter element.

8. A programmable filter, comprising:
a proportional control comprising a plurality of capacitors biased by different input voltages VCC and VCN, wherein the proportional control controls a capacitance value change to ensure a frequency change due to the proportional control remains constant as a voltage controlled oscillator (VCO) operating frequency changes over a VCO frequency range; and
an integral control comprising a filter element with a capacitor C1 and a set of capacitors biased by a voltage output of the filter element,
wherein, to increase frequency, a bias voltage of capacitors $C_E$ and $C_F$ of the plurality of capacitors is switched from VCN to VCC for as long as a phase detector output increase inverse (INCN) is low thereby reducing capacitance of the capacitors $C_E$ and $C_F$ since the VCC is higher than the VCN.

9. The programmable filter of claim 8, wherein when the INCN is high, the bias voltage of the capacitors $C_E$ and $C_F$ is biased to the VCN.

10. The programmable filter of claim 1, wherein to decrease frequency, a bias voltage of capacitors $C_C$ and $C_D$ of the plurality of capacitors is switched from VCC to VCN.

11. A programmable filter, comprising:
a proportional control comprising a plurality of capacitors biased by different input voltages, wherein the proportional control controls a capacitance value change to ensure a frequency change due to the proportional control remains constant as a voltage controlled oscillator (VCO) operating frequency changes over a VCO frequency range; and
an integral control comprising a filter element with a capacitor C1 and a set of capacitors biased by a voltage output of the filter element,
wherein in a normal state a bias voltage of capacitors $C_C$ and $C_D$ of the plurality of capacitors is biased to VCN and a bias voltage of capacitors $C_E$ and $C_F$ is biased to VCC such that the capacitance of the capacitors $C_C$ and $C_D$ has increased and the capacitance of the capacitors $C_E$ and $C_F$ has decreased.

12. The programmable filter of claim 11, wherein a net change in capacitance of the capacitors $C_C$, $C_D$ and $C_E$, $C_F$ is 0.

13. A programmable filter, comprising:
a proportional control configured to have a capacitance biased between a variable voltage input derived from a voltage output of a filter element and a steady state voltage input independent of voltage controlled oscillator (VCO) frequency and controls a capacitance value change to ensure a frequency change due to the proportional control remains constant as the VCO frequency changes over a VCO frequency range; and
an integral control configured to provide the voltage output of the filter element based on a single capacitance.

14. A programmable filter, comprising:
a proportional control configured to have a capacitance biased between a variable voltage input derived from a voltage output of a filter element and a steady state voltage input independent of voltage controlled oscillator (VCO) frequency and controls a capacitance value change to ensure a frequency change due to the proportional control remains constant as the VCO frequency changes over a VCO frequency range; and
an integral control configured to provide the voltage output of the filter element based on a single capacitance,
wherein:
a bias of the proportional control is controlled by phase detector outputs decrease (DEC) and increase inverse (INCN); and
the steady state input voltage is independent of oscillator frequency.

15. A programmable filter, comprising:
a proportional control configured to have a capacitance biased between a variable voltage input derived from a voltage output of a filter element and a steady state voltage input independent of voltage controlled oscillator (VCO) frequency and controls a capacitance value change to ensure a frequency change due to the proportional control remains constant as the VCO frequency changes over a VCO frequency range; and
an integral control configured to provide the voltage output of the filter element based on a single capacitance,
wherein the proportional control is implemented using two sets of variable capacitors ($C_C$, $C_D$) and ($C_E$, $C_F$) controlled by phase detector outputs decrease (DEC) and increase inverse (INCN).

16. A programmable filter, comprising:
a proportional control configured to have a capacitance biased between a variable voltage input derived from a voltage output of a filter element and a steady state voltage input independent of voltage controlled oscillator (VCO) frequency and controls a capacitance value change to ensure a frequency change due to the proportional control remains constant as the VCO frequency changes over a VCO frequency range; and
an integral control configured to provide the voltage output of the filter element based on a single capacitance,
wherein, in a normal state, capacitors $C_C$ and $C_D$ of the proportional control are biased to a steady state voltage (VCC) and capacitors $C_E$ and $C_F$ of the proportional control are biased to a voltage (VCN) derived from the voltage output of the filter element.

17. A programmable filter, comprising:
a proportional control configured to have a capacitance biased between a variable voltage input (VCN) derived from a voltage output of a filter element and a steady state voltage input (VCC) independent of voltage controlled oscillator (VCO) frequency and controls a capacitance value change to ensure a frequency change due to the proportional control remains constant as the VCO frequency changes over a VCO frequency range; and
an integral control configured to provide the voltage output of the filter element based on a single capacitance,
wherein:
to increase frequency a bias voltage of capacitors $C_E$ and $C_F$ of a plurality of capacitors is switched from the voltage VCN to the voltage VCC for as long as INCN is low thereby reducing capacitance of the capacitors $C_E$ and $C_F$ since the voltage VCC is higher than the voltage VCN, and
when the INCN is high, the bias voltage of the capacitors $C_E$ and $C_F$ is biased to the voltage VCN.

18. The programmable filter of claim 13, wherein to decrease frequency, a bias voltage of the capacitors $C_C$ and $C_D$ of the plurality of capacitors is switched from voltage VCC to VCN.

19. A programmable filter, comprising:
a proportional control configured to have a capacitance biased between a variable voltage input (VCN) derived from a voltage output of a filter element and a steady state voltage input (VCC) independent of voltage controlled oscillator (VCO) frequency and controls a capacitance value change to ensure a frequency change due to the proportional control remains constant as the VCO frequency changes over a VCO frequency range; and
an integral control configured to provide the voltage output of the filter element based on a single capacitance,
wherein in a normal state a bias voltage of capacitors $C_C$ and $C_D$ of the plurality of capacitors is biased to the VCN and a bias voltage of capacitors $C_E$ and $C_F$ is biased to the VCC such that the capacitance of the capacitors $C_C$ and $C_D$ has increased and the capacitance of the capacitors $C_E$ and $C_F$ has decreased and a net change in capacitance of the capacitors $C_C$, $C_D$ and $C_E$, $C_F$ is 0.

20. A method comprising controlling capacitance value of a proportional control such that a frequency change due to the proportional control stays constant as voltage controlled oscillator (VCO) operating frequency changes over a VCO frequency range,
wherein the proportional control comprises a plurality of sets of variable capacitors connected to nodes VM1 and VP1 and biased by different input voltages;
an integral control comprises a filter element with a capacitor C1 and a set of variable capacitors connected to the nodes VM1 and VP1; and
one of the different input voltages is a variable voltage derived from a voltage output of the filter element.

21. A method comprising controlling capacitance value of a proportional control such that a frequency change due to a proportional control stays constant as voltage controlled oscillator (VCO) operating frequency changes over a VCO frequency range,
wherein at low values of a voltage output of a filter element (VCNTL1), a variable capacitor implementing the proportional control sees a larger change in capacitance value due to a larger bias voltage swing from a steady state voltage input (VCC) to a variable voltage input (VCN) and the proportional control value change will be lower for higher values of VCNTL1.

22. A design structure embodied in a machine readable medium comprising a memory for designing, manufacturing, or testing an integrated circuit, the design structure comprising:
- a proportional control comprising a plurality of sets of variable capacitors connected to nodes VM1 and VP1 and biased by different input voltages, wherein the proportional control controls a capacitance value change to ensure a frequency change due to the proportional control remains constant as a voltage controlled oscillator (VCO) operating frequency changes over a VCO frequency range; and
- an integral control comprising a filter element with a capacitor C1 and a set of variable capacitors connected to the nodes VM1 and VP1 and biased by a voltage output of the filter element,
- wherein one of the different input voltages is a variable voltage derived from the voltage output of the filter element.

23. The design structure of claim 22, wherein the design structure comprises a netlist.

24. The design structure of claim 22, wherein the design structure resides on the storage medium as a data format used for the exchange of layout data of integrated circuits.

25. The design structure of claim 22, wherein the design structure resides in a programmable gate array.

26. A programmable filter, comprising:
- a proportional control comprising variable capacitors biased by different input voltages, wherein the proportional control controls a capacitance value change to ensure a frequency change due to the proportional control remains constant as a voltage controlled oscillator (VCO) operating frequency changes over a VCO frequency range; and
- an integral control comprising a filter element with a capacitor and a set of variable capacitors biased by a voltage output of the filter element,
- wherein one of the different input voltages is a variable voltage derived from the voltage output of the filter element.

* * * * *